United States Patent [19]

Bolon et al.

[11] 4,049,844

[45] * Sept. 20, 1977

[54] METHOD FOR MAKING A CIRCUIT BOARD AND ARTICLE MADE THEREBY

[75] Inventors: Donald A. Bolon, Scotia; Gary M. Lucas, Schenectady, both of N.Y.; Ralph L. Bartholomew, Painesville, Ohio

[73] Assignee: General Electric Company, Schenectady, N.Y.

[*] Notice: The portion of the term of this patent subsequent to July 6, 1993, has been disclaimed.

[21] Appl. No.: 670,044

[22] Filed: Mar. 24, 1976

Related U.S. Application Data

[62] Division of Ser. No. 509,893, Sept. 27, 1974, Pat. No. 3,988,647.

[51] Int. Cl.² .......................... B05D 5/06; H01B 1/02
[52] U.S. Cl. ........................................ 427/54; 427/44; 427/96; 427/123; 427/125; 427/126; 427/217; 427/282; 428/901; 431/93; 431/94; 431/95 R; 431/95 A; 361/98

[58] Field of Search .................. 96/36.2; 427/44, 96, 427/54, 126, 123, 125, 282, 217; 204/159.15, 159.18; 252/501, 510, 514; 317/101 B, 101 C, 101 CC, 101 F; 200/61.02; 174/68.5; 431/93, 94, 95 R, 95 A; 428/901; 337/413, 414; 354/35, 143

[56] References Cited

U.S. PATENT DOCUMENTS

| | | | |
|---|---|---|---|
| 3,280,741 | 10/1966 | Seymour | 101/426 |
| 3,458,270 | 7/1969 | Ganser et al. | 431/95 |
| 3,551,311 | 12/1970 | Nuss | 427/44 |
| 3,726,728 | 4/1973 | Kruse | 431/93 |
| 3,912,442 | 10/1975 | Cote | 431/95 R |
| 3,937,946 | 2/1976 | Weber | 174/68.5 |
| 3,957,694 | 5/1976 | Bolon et al. | 252/514 |
| 3,968,056 | 7/1976 | Bolon et al. | 106/31 |

*Primary Examiner*—Michael F. Esposito
*Attorney, Agent, or Firm*—William A. Teoli; Joseph T. Cohen; Jerome C. Squillaro

[57] ABSTRACT

A method is provided for making a circuit board involving the screen printing of a radiation curable ink onto the surface of a substrate followed by the radiation cure of the ink. A photoflash circuit board array made by such method is also provided.

9 Claims, 3 Drawing Figures

METHOD FOR MAKING A CIRCUIT BOARD AND ARTICLE MADE THEREBY

This is a division of application Ser. No. 509,893, filed Sept. 27, 1974, now U.S. Pat. No. 3,988,647.

Prior to the present invention, circuit boards were often made by etching copper-clad laminates in accordance with standard negative photo-resist procedures. In particular situations, where cost was not a problem and where long, air polluting cures could be tolerated, conductive inks were available which could be directly applied onto the substrate surface in a patterned manner.

Although conductive pastes often simplify the production of circuit boards in many instances, the conductive pastes are frequently limited to particular substrates depending upon the manner by which the paste is cured. The cure of one available paste, for example, is based on the evaporation of a volatile solvent. However, organic solvents often damage thermoplastic substrates when allowed to contact substrate surfaces over extended evaporation periods. In addition, air pollution hazards has reduced the use of such materials for mass production applications.

Another type of curable ink must be fired at an elevated temperature before it becomes conductive. A conductive powder is used in combination with a glass, as shown for example by J. E. Jolley, Solid State Technology, May 1974, pages 33-37. In order to render the ink conductive, it is necessary to heat the ink at temperature up to 900° C. As a result, such conductive inks can only be employed on ceramic substrates which are able to withstand such extreme temperature conditions.

As shown by Ehrreich et al. U.S. Pat. No. 3,202,488 and Gillard U.S. Pat. No. 3,412,043, additional curable inks are available based on the employment of an epoxy resin which can be employed in the form of either a one-package or two-package system. An advantage of the two package system is that a low temperature cure can be achieved. However, the catalyst must be mixed with the resin immediately prior to use, and the ink remains tacky for several hours. In addition, the two package method cannot be used to make circuit boards in a continuous manner, since a batch of mixture having a relatively short pot life must be freshly prepared. Although the one-package system allows for faster cures, higher temperatures are required to release the curing catalyst. Accordingly, such epoxy systems are either undesirable on thermoplastic substrates, which cannot tolerate elevated cure temperature, or are unsuitable for economic mass production procedures because of long cure times.

Although recent improvements have eliminated, in many instances, the need for time consuming etching procedures for making circuit boards, based on the direct application of curable inks which can be rendered conductive upon cure, no curable printing inks are available which can be rapidly cured within two minutes or less to the conductive state and which can be used on a wide variety of substrates, including thermoplastic substrates.

The present invention is based on the discovery that certain radiation curable organic resins, which include UV curable resins which are shown in copending U.S. Pat. No. 3,968,056 of Bolon et al., filed concurrently herewith and assigned to the same assignee as the present invention, can be used in combination with certain particulated electrically conductive metal or particulated electrically conductive metal containing material, such as metal coated glass spheres or fibers, to produce a radiation curable ink which is rendered conductive upon cure. A surprising feature of the aforementioned radiation curable inks is that the shape of the particulated conductive material largely determines whether the radiation curable ink will cure satisfactorily. For example, unsatisfactory cures can result, if the particulated electrically conductive metal containing material is in the form of flakes. Flakes are defined within the meaning of the present invention as being a metal, or electrically conductive metal containing materials which have an aspect ratio D/T of greater than 20, where "D" is the diameter of the flake the "T" is the thickness. Experience has shown that the particulated electrically conductive material employed in the practice of the invention is preferably spherical, spheroidal or oblong spherical in shape. Although less desirable than spheres, metal fibers, or glass fibers coated with metal have been found to be more effective than metal flakes, with respect to allowing satisfactory cures of the photo curable ink when it is subjected to radiation cure. It has been found, however, that up to about 15% by weight of flakes based on the weight of particulated electrically conductive metal containers material can be tolerated in the radiation curable ink without adverse results.

There is provided by the present invention a method for making a circuit board having conductive circuit elements with a specific resistivity of less than 10 ohm-cm. patterned on a nonconductive substrate, which comprises, 1. printing a radiation curable ink onto the nonconductive substrate to a desired circuit pattern, and
2. effecting the radiation cure of the radiation curable ink at ambient temperatures, where said radiation curable ink comprises by volume
   A. from about 10% to 60% of an organic resin binder having a viscosity of from 50 to 10,000 centipoises at 25° C., and
   B. from about 90% to 40% of a particulated electrically conductive metal containing material substantially free of metal containing material having an aspect ratio of diameter to thickness of a value greater than 20.

Radiation curable inks which can be used in the method of the present invention are shown in our copending U.S. Pat. No. 3,968,056, filed concurrently herewith and assigned to the same assignee as the present invention, which includes a blend of a polyester and styrene as the organic resin binder and silver coated glass spheres, or spheroids, sometimes referred to as "beads" which have an average diameter of about 6 to 125 microns and preferably 10 to 50. These materials are commercially available and are made from glass spheres employed as reflective filler materials. Also included are particulated metals such as iron, zinc, nickel, copper, etc., which have average diameters as previously defined and are substantially free of a nonconductive oxide coating. Procedures for making such conductive particles by plating with silver, or initially priming with copper followed by plating with silver, or noble metals, as shown by Ehrreich U.S. Pat. No. 3,202,483. Glass fibers coated with silver, copper or nickel as shown for example in French Pat. No. 1,531,272 also can be used.

Particulated metals such as iron, nickel, copper, zinc, etc. in the forming of spheres, spheroids or oblong spheroids, metal or fibers also can be used which have been reduced in a hydrogen or other reducing atmosphere at elevated temperatures to effect the removal of any oxide coating sufficient to render the metal particles non-conductive. The particulated metal in reduced form can be shielded from oxygen prior to being treated with the organic resin binder. The resulting radiation curable ink can be stored under sealed conditions prior to use.

Some of the organic resin binders which can be used in making the radiation curable inks of the present invention in combination with the above-described electrically conductive particulated material are in the form of either low molecular weight aliphatically unsaturated organic polymers, or a mixture of an aliphatically unsaturated organic polymer in further combination with a copolymerizable aliphatically unsaturated organic monomer such as styrene. The aforementioned solventless aliphatically unsaturated organic resin materials can have a viscosity of from about 50 to 10,000 centipoises at 25° C.

One variety of the solventless resins which can be employed in combination with the particulated electrically conductive metal containing material in the production of the radiation curable ink of the present invention, are low molecular weight polyamides containing acrylamide unsaturation, such as shown in U.S. Pat. No. 3,535,148, Ravve. These materials can be colorless liquids having relatively low viscosity. Another example is low molecular weight polyesters containing acrylic unsaturation shown by U.S. Pat. No. 3,567,494, Setko. Additional examples of solventless resins are acrylate esters, or methacrylic esters of polyhydric alcohols, such as shown by U.S. Pat. Nos. 3,551,246, and 3,551,235, Bassemir. Further examples are shown by Nass U.S. Pat. No. 3,551,311. In addition, there also is included acrylate or methacrylate esters of silicone resins, acrylate or methacrylate esters, melamine, epoxy resins, allyl ethers of polyhydric alcohols, allyl esters of polyfunctional aliphatic or aromatic acids, low molecular weight maleimido substituted aromatic compounds, cinnamic esters of polyfunctional alcohols, or mixtures of such compounds, etc.

The organic resin binder which can be used in combination with the above described particulated conductive metal containing materials can be further defined as unsaturated polymers, for example, a polyester from a glycol and $\alpha,\beta$-unsaturated dicarboxylic acids, such as maleic and fumaric acids, with or without other dicarboxylic acids free of $\alpha,\beta$ unsaturation, such as phthalic, isophthalic, succinic, etc., dissolved in a copolymerizable aliphatically unsaturated organic solvent, such as styrene, vinyl toluene, divinyl benzene, methyl methacrylate, etc., or mixtures of such materials. Examples of such solventless resin compositions are shown by U.S. Pat. Nos. 2,673,151 and 3,326,710, Brody; a further example is shown by South African Pat. 694,724. Also included are unsaturated organosiloxanes having from 5 to 18 silicon atoms, which can be employed in combination with a vinylic organic monomer.

In instances where it is desired to make a UV curable ink, UV sensitizers can be employed when the oganic resin binder is in the form of a polyester or polyacrylate or other polymerizable UV curable material. There can be employed from about 0.5 to 5% by weight of the UV sensitizer based on the weight of resin. Included among the ultraviolet radiation photosensitizers which can be used are, for example, ketones such as benzophenone, acetophenone, benzil, benzyl methyl ketone; benzoins and substituted benzoins such as benzoin methyl ether. $\alpha$-hydroxymethyl benzoin isopropyl ether; sulfur compounds such as thiourea, aromatic disulfides, and other photosensitizers such as azides, thioketones, or mixtures thereof. There also can be used in the ink, UV stabilizers and antioxidants such as hydroquinone, tert butyl hydroquinone, tert butyl catechol, p-benzoquinone, 2,5-diphenylbenzoquinone, 2,6-di-tert-butyl-p-cresol, benzotriazoles such as Tinuvin P (manufactured by Geigy Corp)., hydroxybenzophenones such as 2,4-hydroxybenzophenone, 2-hydroxy-4-methoxy-benzophenone, 4-dodecyl-2-hydroxybenzophenone, substituted acrylonitriles such as ethyl-2-cyano-3,3-diphenyl acrylate, 2-ethylhexyl-2-cyano-3,3-diphenyl acrylate, etc. also can be used.

In addition as shown by Gebhartt et al., Farbe und Lack 64 303 (1958) small amounts of a paraffin wax, up to 2% by weight, such as a 135° F M.P. can be incorporated into resins which contain polymerizable groups subject to oxygen inhibition. Such wax substantially reduces such oxygen inhibition which manifests itself as surface tack. Alternatively, the wax may be omitted when radiation cures are to be conducted in an inert atmosphere. It also has been found that the conductivity of the cured ink can be impaired if chloride containing components are used which introduce more than 100 parts of chloride, per million of organic resin binder.

Additional examples of the organic resin binder which can be used in the practice of the invention are radiation curable epoxy compositions shown in copending applications of James Crivello, Ser. Nos. 466,374, 466,375, and 466,378, filed May 2, 1974, all now abandoned, assigned to the same assignee as the present invention. These Crivello compositions are one-package radiation curable epoxy resins containing aromatic onium salts of the Group V1A elements, such as sulfur, aromatic halonium salts, and Group VA elements such as arsenic which break down under the influence of radiant energy to release a Friedel-Crafts catalyst such as borontrifluoride to effect the cure of the epoxy resin.

The epoxy resins which also can be utilized as the organic resin binder to produce the photo curable inks of the present invention includes any monomeric, dimeric or oligomeric or polymeric epoxy material containing one or a plurality of epoxy functional groups. Diluents such as 4-vinylcyclohexene dioxide, limonene dioxide, 1,2-cyclohexene oxide, styrene oxide, etc., may be added as viscosity modifying agents.

In the practice of the invention, the radiation curable ink can be made by simply blending the particulated electrically conductive metal containing conductive material, which may be referred to hereinafter as the "conductive filler", with the organic resin binder, which hereinafter may be referred to as the resin.

Depending upon such factors as the viscosity of the resin, and the particle size and nature of the conductive filler, the resulting radiation curable ink can vary widely and can be a free flowing fluid or a paste. In instances where it is desired to make a UV curable conductive ink, a photosensitizer can be incorporated into the resin prior to blending with the conductive filler. There can be employed on a weight basis from about 0.5 part to 10 parts of filler per part of resin. If desired, electron beam cure of the ink also can be effected.

Blending can be achieved by simply stirring the ingredients in a suitable container. In instances where the conductive filler is in the form of particulated metal which has been freshly subjected to hydrogen reduction at temperatures of 300° to 800° C. to effect removal of sufficient oxide coating to render the filler conductive, or a chemical treatment involving the use of a dilute ammonium persulfate solution, a special blending technique is preferably employed. The resin can be treated with a dry inert gas, such as passing the gas under the resin surface along with agitation to remove any oxygen, or moisture therefrom. Blending with the freshly reduced filler is also achieved under sealed conditions such as a dry box. The resulting radiation curable ink can be used in a standard manner to produce desirable conductive coatings, if radiated with either ultraviolet light having a wave length of between 1849A to 4000A or electron beam within a reasonable time after being applied to a substrate such as up to 10 minutes.

A more complete understanding of the method of the present invention can be obtained by referring to:

Figure 1:
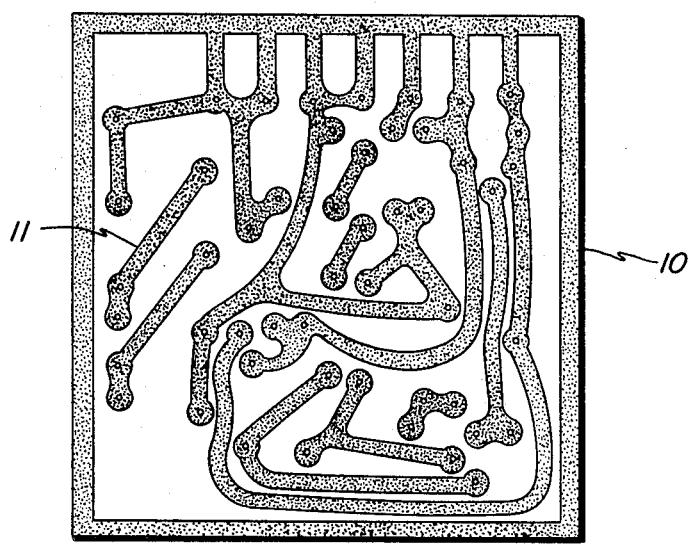
FIG. 1 shows a typical circuit board which can be made in accordance with the method of the invention having conductive circuit elements shown in light shading.

With further reference to FIG. 1, there is shown a typical circuit board consisting of a substrate at 10 having conductive circuitry exemplified by 11. These conductive circuit elements can be formed on the surface of 10 in accordance with the method of the invention by applying the above described radiation curable ink onto the substrate surface by standard printing or roto-gravure techniques. For example, 100 to 400 mesh stainless steel screen can be used to apply the radiation curable ink to a thickness of 3 to 5 mils on the surface of the substrate in the circuit pattern desired. Suitable substrates include, for example, polystyrene, polycarbonate, polyethylene terephthalate, polypropylene, polyacrylates, etc.

Cure of the radiation curable ink can be achieved with conventional U.V. discharge lamps such as one or more GEH3T7 suitably ballasted to achieve the desired degree of intensity. U.V. radiation having a wavelength of between about 1849 to 4000A can be used effectively.

In order to insure a cure time of between 1 to 2 minutes or less, it has been found desirable to operate the lamps at a sufficient flux to provide at least 15,000 microwatts of light per sq. cm. The flux can be varied by altering the lamp ballast, the distance from the substrate, etc.

Figure 2:
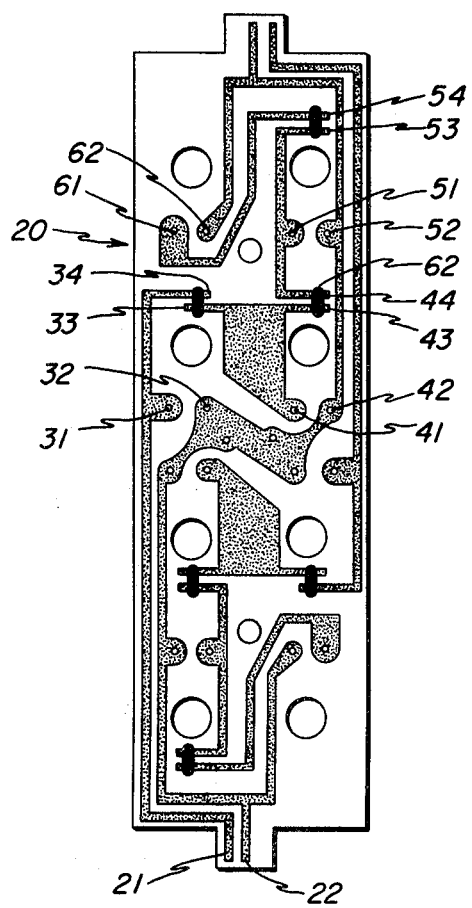
FIG. 2 shows a particular type of circuit board array having conductive circuit elements shown with light shading which can be formed in accordance with the method of the invention, and nonconductive switch elements shown in dark shading applied in a subsequent step, as discussed below.

The circuit board of FIG. 2, more particularly shows a circuit board array suitable for a multiple flash unit for sequential firing of flash bulbs consisting of a nonconductive substrate at 20, plus in Tabs at 21 and 22 which electrically connect terminals 31 and 32. Resistive switch elements are shown typically across 33 and 34. These resistive switch elements can be made by subsequently applying compositions described in copending application Ser. No. 460,801, filed Apr. 15, 1974 by F. F. Holub et al., now abandoned, and copending application Ser. No. 473,151, filed May 24, 1974 now abandoned of F. F. Holub et al. both assigned to the same assignee as the present invention, onto circuit boards made in accordance with the methods of the present invention.

A typical switch composition can consist in part of a mixture of silver oxide in combination with either silver carbonate or certain organic materials containing chemically combined silver, such as silver pyruvate, silver acetyl acetonate, or silver salts of either aliphatic or aromatic carboxylic acids. The switch composition also can contain a binder for the aforementioned blend of silver compounds in the form of substantially water resistant organic materials such as cellulose esters, cellulose ethers, polyacrylates, polycarbonate and polystyrene and more specifically cellulose nitrate, ethyl cellulose, ethyl hydroxyethyl cellulose, polymethylmethacrylate, polymethylacrylate, etc.

Figure 3:
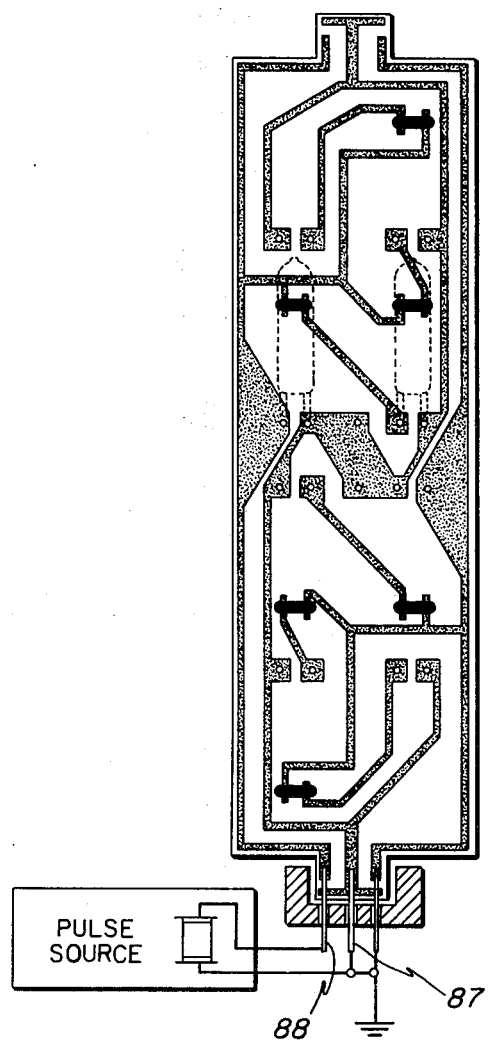
FIG. 3 is another version of the circuit board array of FIG. 2 having the nonconductive switch elements connected in parallel rather than in series.

Various particulate fillers can also be incorporated into the above described switch composition to improve rheological properties of the liquid coating mixture such as bodying agents or adhesion promoters as well as to improve switch performance on the circuit board. For example, the incorporation into the switch mixture of up to about 2% by weight of finely divided carbon particulates can improve radiation absorption of the solid switch when light colored silver source materials are used and also improve deposition of the coating mixture. Dispersing agents such as nonionic surfactants have also been found useful in preparing a liquid suspension of the switch material which can be cured or dried to provide the desired switching capability. In depositing the switches for a preferred circuit board embodiment of the present invention wherein each switch is located between a pair of spaced apart electrical terminals on the circuit board, as shown in FIGS. 2 and 3, conventional techniques may be used requiring an organic diluent or solvent. Useful solvents include pine oil, hydrocarbon fluids, esters, for example, an ether ester, etc., which are conventionally used in silk screening. The liquid coating mixture for deposition is formed by mixing the silver source material with the organic binder and solvent to form a slurry. This may be applied across the terminals by conventional means as a thin coating and the solvent thereafter removed by evaporation to provide the solid switch.

Useful stabilizer additives for incorporation into the switch material compositions to inhibit moisture attack can be selected from the general class of organic compounds which react with silver ion to form an insoluble reaction product. Weak organic acids have been found useful when added in small but effective amounts of about 0.5–2.0 weight percent of the switch material composition. Aromatic triazole compounds selected from the group consisting of benzotriazole and carbon substituted benzotriazoles, such as tolyl triazole have been found especially effective.

Further reference is made to the circuit board of FIG. 2 which can form part of a multiple photoflash array useful for a camera. An electrical energy source which may be contained within the camera can be connected to contact tabs 21 and 22 so that a firing pulse produced by a source can be applied across said contacts depending upon the type of lamps used in the flashlamp array. The flashlamps in the multiple flash array can be the so-called high voltage type, requiring a pulse of approximately of 1000–2000 volts, the firing pulse source may comprise a suitable battery-capacitor discharge and voltage step-up transformer type circuit, or may employ a compact piezoelectric element arranged to be impacted or stressed in synchronization with opening of the camera shutter, so as to produce a firing pulse having a voltage of approximately 1000 to 2000 volts and of sufficient energy to fire a single flashlamp. An example of a high voltage flashlamp and a firing pulse source comprising a piezoelectric element synchronized with a camera shutter is described in U.S. Pat. Nos. 2,972,937 and 3,106,080, both to C. G. Suits.

Radiation switches which are suitable in a flash-sequencing circuit of the type above generally described are also known. These switches which can be employed in various ways are converted from a high resistance or open circuit condition upon flashing of an adjacent flashlamp in the array to provide a low resistance circuit path to another unflash lamp. A solid static switch which operates in this manner is described previously in copending patent application, Ser. No. 460,801, filed Apr. 15, 1974, entitled "Switching Devices for Photoflash Unit", in the names of F. F. Holub et al., and assigned to the assignee of the present invention. The described switch material composition comprises a mixture including a carbon-containing silver salt and an organic polymer binder exhibiting improved shelf life under conditions of high relative humidity especially at above normal ambient temperatures. Various modifications of such switch material composition are disclosed to include a mixture of silver oxide with a carbon-containing silver salt as the silver source which is converted to elemental silver upon lamp flashing along with incorporation of various additives to improve the desired performance. One disclosed type of additive is a radiation absorptive filler such as carbon if the silver source itself does not absorb sufficient impinging actinic radiation from the flashlamp reliably to provide a low ohmic conversion.

With further reference to FIG. 2, a pulse can activate a flashbulb if it is connected across terminals 31 and 32. The switch element connected to 33 and 34, open prior to the activation of the flashbulb across 31 and 32, closes after flashing. The conversion of the switch from the open or non-conductive state to the conductive or closed state is based on a chemical change taking place in the switch material. As a result of the closing of the switch across 31 and 32, a new lamp is electrically connected across terminals 41 and 42 and becomes ready for firing. A sequential procedure of flashing and closing of switches, can be continued by activating the remaining terminals 51 and 52 and 61 and 62.

FIG. 3 is another form of the type of circuit board which can be made in accordance with the practice of the invention, having switches as described in FIG. 2 connected in parallel instead of series. As described in copending application, Ser. No. 485,460, filed July 3, 1974, now U.S. Pat. No. 3,980,876, and assigned to the same assignee as the present invention, the circuit board shown in FIG. 3 can be part of a multiple flash unit having a transverse protection terminal which momentarily electrically shorts across the socket contacts at 87 and 88 while the unit is being plugged into camera socket. The shorting serves to discharge any residual voltage in the firing pulse source before the lamp connector terminals engage the socket contacts.

In order that those skilled in the art will be better able to practice the invention, the following examples are given by way of illustration and not by way of limitation. Unless otherwise indicated, all parts are by weight.

EXAMPLE 1

A polyester prepolymer was prepared by effecting reaction between about 35.3 parts of fumaric acid, 11.9 parts of dicyclopentadiene and 25.3 parts of propylene glycol. The resulting prepolymer was blended with about 24.4 parts of styrene, containing 100 ppm of tert-butyl-hydroquinone stabilizer, 1.8 parts of benzoin-sec-butylether and 0.35 parts of 135° F. paraffin wax.

A radiation curable ink was prepared by blending the above organic resin binder with 67 parts of silver coated glass spheres having an average diameter of about 10-50 microns. On a volume basis, there was employed about 2 volumes of conductive filler per volume of resin.

The above curable ink was printed onto a 2 inch by 6 inch polystyrene substrate in accordance with the procedure of the present invention and in accordance with the pattern shown in the drawing. The treated polystyrene substrate was then placed at a distance of about 8 inches from the arc tube of a General Electric H3T7 lamp which has been ballasted to permit operation at about 960 watts input. There was employed two quartz filters below the lamp having dimensions of about 5 inches × 10 inches. The filters were supported on steel supports which formed a channel through which air was blown. The upper filter support was in contact with a 6 foot copper coil having an average diameter of about ⅜ inch through which water was passed at about 25° C. The full intensity of the lamps was measured at about 20,000 $\mu\omega/cm^2$ and the temperature of the substrate did not exceed about 50° C. After 2 minutes cure, the ink in the panel was tested for continuity. Cure of the ink on the panel can be determined by a bake cycle of 60 minutes at 70° C. after irradiation. If after the 2 minute exposure, the ink strip is tack free and it shows no more than a 2% weight loss based on the weight of tack-free ink, it is cured. It was found that the resulting conductive cured ink had a specific resistivity of 0.015 ohm-cm.

A switch coating mixture was prepared with 4.5 grams silver carbonate, 0.5 gram silver oxide, 0.1 gram of an acetylenic glycol type non-ionic surfactant, and 0.17 gram ethyl hydroxyethyl cellulose binder. Said mixture was prepared by dissolving the cellulose binder constituent in mixed organic solvents and dispersing the silver source materials therein with the surfactant. The coating mixture was in the form of a paste that was subsequently stencilled onto polystyrene circuit boards already having printed silver conductors thereon. Eight individual switching elements were deposited on each board for electrical testing with each switch having the configuration of an approximately ⅜ inch diameter disc of 78 microns average thickness. The switch elements were then dried in conventional fashion and exhibited an electrical resistance value of approximately $1.6 \times 10^{11}$ ohms prior to further testing in the manner described below.

One board was tested for flashing sensitivity by the flashing of an adjacent high-voltage type flashlamp located approximately ½ inch from the switch surface. Two of the switches converted to an electrical resistance less than one ohm upon the flashing of a bare lamp whereas two additional switches converted to a similar resistance value when a lamp was flashed having a 50% light transmitting metal screen positioned between the lamp and the switch elements. The remaining switches were further tested for conversion with 36% and 29% light transmitting screen filters but did not undergo comparable conversion which indicated some limitation upon the flashing sensitivity of the particular switch material composition.

Further evaluation of the switching elements on the three remaining circuitboards was conducted to determine shelf life and stability to environmental conditions. More particular, it has been found for commercial applications that one requirement is for the switch elements to remain operative after being exposed to conditions of 96% relative humidity at a temperature of 120° F for 14 days. In this procedure, a sealable glass chamber partially filled with water is heated to a temperature of 120° F and a test circuitboard is placed in the chamber above the water level. The switches are thereby exposed to moisture at 96% relative humidity but without condensation of water on the surface of the switches. During this test, the chamber is opened at intervals and the board is removed to have the electrical resistance of the switches measured in various ways as hereinafter further described. An object of this electrical testing is to be sure that the electrical resistance does not fall below $10^8$ ohms when a 30 volts DC voltage is impressed across the individual switches with a further object being an ability to convert each switch to less than 5 ohms electrical resistance by flashing of an adjacent lamp off after the switches have experienced the aforementioned humidity exposure. To determine the initial electrical resistance of the switches, two switches on each board were converted by flashing before the boards had been subjected to humidity exposure and the after flash electrical resistance found to be less than 5 ohms with most exhibiting a 1 ohm resistance. After a two-week humidity exposure one board was flashed and all switches converted to approximately 2.8 ohms average resistance thereby demonstrating that humidity exposure had not damaged the flashing sensitivity. A second board was tested for electrical resistance after the 14-day humidity exposure by impressing the 30 volt DC voltage across the switches after the switches had been conditioned with a high-voltage pulse at the level experienced during actual circuitboard operation. Four switches on this board were found to exhibit greater than $10^8$ ohm electrical resistance, but the remaining two switches were found to only have 60 megohm and 300 megohm resistance values which are considered too low. The final board was subjected to a third week of humidity exposure as hereinbefore described and the switch elements subsequently flashed with all six switches converting to elemental silver having an average 1.9 ohm resistance value.

In summary, it can be said of the foregoing electrical tests that a switch material composition which does not contain the present stabilizer additives can demonstrate adequate flashing sensitivity and convertibility after 14-day humidity exposure but fails to maintain the high initial electrical resistance.

EXAMPLE 2

A radiation curable ink was prepared by blending together about 2 parts of the silver coated glass beads of Example 1 with one part of an organic resin binder consisting of 70 parts of the acrylated epoxidized soybean oil and 30 parts of ethylhexyl acrylate with 2 parts of the photosensitizer of Example 1. Prior to mixing, the volume of the glass coated silver beads was approximately 2 times the volume of the organic resin binder.

The radiation curable ink was applied onto a polystyrene substrate in accordance with the procedure of Example 1 and thereafter cured under ultraviolet light. The specific resistivity of the cured conductive coating was found to be 0.015 ohms-cm.

Following the switch testing procedure in the foregoing example, test printed circuit boards were constructed according to the present invention by depositing a switch material composition consisting of 4.5 grams silver carbonate, 0.5 grams silver oxide, 0.01 grams benzotriazole, 0.1 grams of the same surfactant, and 0.17 grams of the same ethyl hydroxyethyl cellulose binder. Upon removal of the mixed solvents employed in preparing said liquid dispersion, the initial electrical resistance of the switch elements was measured and found to average $8 \times 10^{12}$ ohms which is a higher electrical resistance, surprisingly, than was obtained without the present stabilizer additives. Upon testing four circuitboards fabricated with this material composition in the same manner described in the previous example it was found that all switches performed in an improved manner. One board survived the 14-day humidity exposure by demonstrating flashing sensitivity wherein all switches converted to an average 2.4 ohms electrical resistance and all switches of a second board demonstrated an electrical resistance greater than $10^8$ ohms when measured before a high-voltage pulse had been impressed across the switches. All switches of a third board still exhibited greater than a $10^8$ ohm resistance value after a high-voltage pulsing. The final board also survived a third week of humidity exposure in better fashion by maintaining an electrical resistance before conversion greater than $10^8$ ohms.

EXAMPLE 3

A radiation curable ink is prepared by forming a blend of 2 parts of the silver coated glass beads of Example 1 and one part of an epoxy resin binder. The epoxy resin binder consists of about 15 parts of vinylcyclohexene dioxide and 85 parts of (3,4-epoxycyclohexyl)methyl-3,4-epoxycyclohexanecarboxylate. In addition, there is also used in the organic resin binder, 2 parts of triphenyl sulfoniumhexafluoroarsenate as a photosensitizer. Prior to mixing, it is found that the volume of the silver beads is approximately 2 times the volume of the binder resin.

The above described radiation curable ink is screened to a thickness of 5 mil onto a polyethylene terephthalate film substrate to the same pattern as shown in FIG. 3. It is subjected to ultra-violet radiation as described in Example 1 and it cures within 2 minutes. The cured conductive strip is found to have a volume resistivity of about 0.05 *ohm-cm*.

Still different preferred switch material compositions contain varying proportions of a non-ionic type surfactant in order to desirably reduce the initial electrical resistance of the switching elements. More particularly, it has been found that up to 4 weight percent non-ionic surfactant in the mixture can reduce the initial electrical resistance without thereafter adversely affecting its performance as a switching element. The material compositions listed in tabular form below otherwise correspond to the formulation disclosed in preceding Example II except for a 0.005 gram substitution of the benzotriazole constituent and variation in weight of the same surfactant previously employed.

| GRAMS SURFACTANT | INITIAL ELECTRICAL RESISTANCE |
| --- | --- |
| 0 | $6 \times 10^{12}$ ohms |
| 0.027 | $2 \times 10^{11}$ ohms |
| 0.05 | $10 \times 10^{9}$ ohms |
| 0.086 | $11 \times 10^{9}$ ohms |
| 0.112 | $10 \times 10^{9}$ ohms |
| 0.133 | $10 \times 10^{8}$ ohms |
| 0.150 | $9 \times 10^{8}$ ohms |
| 0.180 | $7 \times 10^{8}$ ohms |

The above variation in surfactant content illustrates that electrical resistance can be regulated significantly in this manner.

Useful non-ionic surfactants based on the weight of the organic binder in the present switch material composition include polyoxyethylenes, ethoxylated alkylphenols, ethoxylated aliphatic alcohol, carboxylic esters, carbosylic block copolymers, etc.

It will be apparent from the foregoing description that various modifications may be made in the above representative embodiments without departing from the true spirit and scope of the present invention. For example, it is not essential that the switch element be deposited directly on a printed circuitboard or operated only in conjunction with a planar flashlamp array which can illuminate only in a single direction. In addition, although the advantages of making the circuit boards of the present invention in accordance with the method of the present invention are clearly evident from the foregoing description, it should be evident that other cure techniques such as the one based on organic solvent evaporation can be employed in certain instants if cure time and air pollution are not significant considerations.

In addition, although ambient cure temperatures provide effective results in the practice of the method of the invention a cure temperature of up to about 60° C is preferred.

It has also been found that the circuit boards made in the practice of the inventions as shown by FIGS. 1-3 can be subjected to a Tropical Humidity Test requiring exposure for 14 days at a temperature of 120° F and a RH of 96% without any substantial change in either conductivity or switch performance occurring.

What we claim as new and desire to secure by Letters Patent of the United States is:

1. A method for making a circuit board having conductive circuit elements with a specific resistivity of less than 10 ohm-cm patterned on a nonconductive substrate, which comprises,
   1. printing a radiation curable ink onto the nonconductive substrate to a desired circuit pattern, and
   2. effecting the radiation cure of the radiation curable ink, where said radiation curable ink comprises by volume
      A. from about 10% to 60% of an organic resin binder having a viscosity of from 50 to 10,000 centipoises at 25° C., and
      B. from about 90% to 40% of a particulated electrically conductive metal containing material substantially free of metal containing material having an aspect ratio of diameter to thickness of a value greater than 20.

2. A method in accordance with claim 1, where the radiation curable ink is screen printed onto the nonconductive substrate.

3. A method in accordance with claim 1, where the radiation cure is achieved with ultraviolet light.

4. A method of claim 1, where the curable ink utilizes silver coated glass spheres or spheroids as the particulated electrically conductive metal containing material.

5. The method of claim 1, where the nonconductive substrate is polystyrene.

6. The method of claim 4, where a mixture of a polyester resin and styrene are used as the organic resin binder.

7. The method of claim 1, having a subsequent step for the application of a switch composition onto the nonconductive substrate to produce a circuit board suitable for a photolamp array consisting of flash lamp connection areas and switching circuitry allowing for the consecutive flashing of photolamps electrically connected thereto.

8. The method of claim 7, where the switch composition comprises a mixture of silver oxide and silver carbonate.

9. The method of claim 8, where the switch composition contains an effective amount of benzotriazole.

* * * * *